(12) United States Patent  (10) Patent No.: US 7,023,524 B2
Van Dijsseldonk et al.  (45) Date of Patent: Apr. 4, 2006

(54) LITHOGRAPHIC APPARATUS AND DEVICE MANUFACTURING METHOD

(75) Inventors: Antonius Johannes Josephus Van Dijsseldonk, Hapert (NL); Marcel Mathijs Theodore Marie Dierichs, Venlo (NL); Harm-Jan Voorma, Zaltbommel (NL)

(73) Assignee: ASML Netherlands B.V., Veldhoven (NL)

( * ) Notice: Subject to any disclaimer, the term of this patent is extended or adjusted under 35 U.S.C. 154(b) by 37 days.

(21) Appl. No.: 10/738,129

(22) Filed: Dec. 18, 2003

(65) Prior Publication Data

US 2005/0134818 A1    Jun. 23, 2005

(51) Int. Cl.
 G03B 27/52    (2006.01)
 G03B 27/72    (2006.01)

(52) U.S. Cl. .......................................... 355/55; 355/69
(58) Field of Classification Search ................. 355/53, 355/55, 67–71; 356/399–400; 250/548
 See application file for complete search history.

(56) References Cited

U.S. PATENT DOCUMENTS

| | | | |
|---|---|---|---|
| 5,323,263 A * | 6/1994 | Schoenmakers | 359/366 |
| 5,757,469 A | 5/1998 | Allen | |
| 6,741,329 B1 * | 5/2004 | Leenders et al. | 355/53 |
| 6,859,328 B1 * | 2/2005 | Schultz et al. | 359/633 |
| 2001/0002155 A1 | 5/2001 | Takahashi et al. | |
| 2002/0085286 A1 | 7/2002 | Drodofsky et al. | |
| 2004/0013226 A1 * | 1/2004 | Bakker et al. | 378/34 |
| 2004/0160583 A1 * | 8/2004 | Mulkens et al. | 355/30 |

FOREIGN PATENT DOCUMENTS

| | | |
|---|---|---|
| EP | 1 020 769 A2 | 7/2000 |
| EP | 1 115 019 A2 | 7/2001 |

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus including a radiation attenuator or a variable aperture system, such as masking blades, arranged in or adjacent an intermediate focus of the projection system. Besides a radiation attenuator or a variable aperture system, a measuring system may be arranged in the intermediate focus. By placing one or more of such systems in or adjacent the intermediate focus of the projection system, instead of adjacent the reticle in the illumination system, fewer design restrictions occur because of more space available, resulting in a lower design cost.

13 Claims, 2 Drawing Sheets

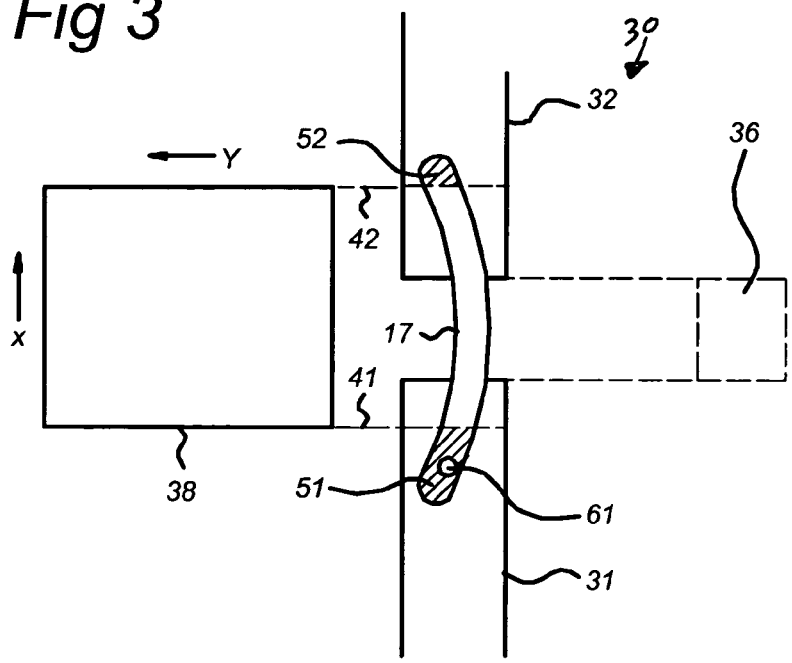
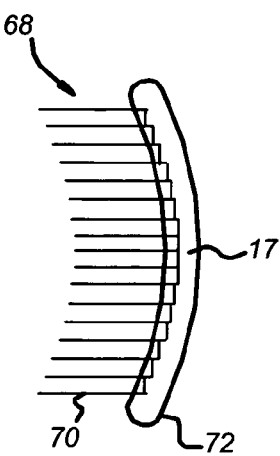
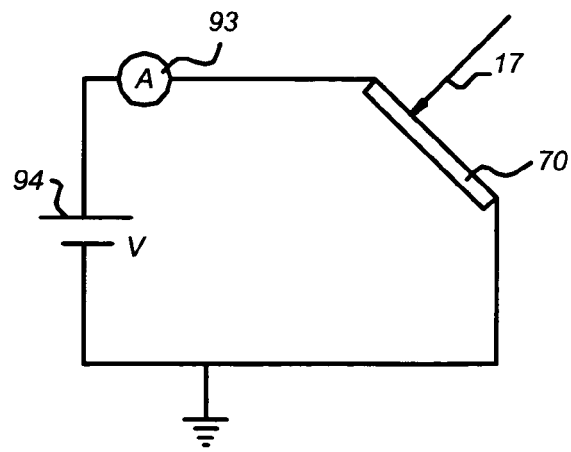

LITHOGRAPHIC APPARATUS AND DEVICE MANUFACTURING METHOD

BACKGROUND OF THE INVENTION

1. Background of the Invention

The present invention relates to a lithographic apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one exposure, and so-called scanners, in which each target portion is irradiated by scanning the pattern through the beam of radiation in a given direction (the "scanning"-direction) while synchronously scanning the substrate parallel or anti-parallel to this direction.

A lithographic apparatus may include an illumination system configured to provide a beam of radiation to a reticle. The reticle may be of a reflective or transmittive type. After the beam has been reflected or transmitted by the reticle, the beam is provided with a pattern which was present on the reticle. The so-called 'patterned beam' is then projected onto a target portion of a substrate by a projection system. In EUV lithography, the illumination system and the projection system include optical mirrors to process the radiation beam. In current illumination systems, a radiation attenuator may be positioned to attenuate the radiation beam such as to manipulate the positioning and size of the beam on the target portion of the reticle. In EUV lithographic apparatus, the most suitable place to arrange a radiation attenuator in an illumination system is very close to the reflective reticle. However, for example, reticle masking blades systems can be relatively large. Because of a limited space, together with the relatively large dimensions of such reticle masking blades, the design of such systems is restricted.

SUMMARY OF THE INVENTION

It is an aspect of the present invention to reduce manufacturing costs of a lithographic apparatus by realizing fewer design restrictions.

Therefore, according to an aspect of the present invention, there is provided a lithographic apparatus including an illumination system configured to provide a beam of radiation; a support configured to support a patterning structure, the patterning stricture configured to impart the beam of radiation with a pattern in its cross-section; a substrate table configured to hold a substrate; and a projection system configured to project the patterned beam onto a target portion of the substrate, the projection system having an intermediate focus, wherein the apparatus includes, in or adjacent the intermediate focus, a radiation attenuator configured to attenuate the patterned beam, a variable aperture system configured to pass at least a part of the patterned beam, and/or a radiation measuring system configured to measure an intensity of the patterned beam.

By placing a radiation attenuator, a variable aperture system and/or a measuring system in or adjacent the intermediate focus (IF) of the projection system, instead of near the reticle in the illumination system, more space is available and fewer design restrictions are present, which reduces the cost of the apparatus.

By placing a radiation measuring system in or adjacent the IF of the projection system, such as an intensity monitor sensor, the radiation can be measured relatively close to the substrate, so only the degradation effects of optics between this IF and the substrate are not measured. It is noted that in the intermediate focus one or more radiation systems can be arranged in combination with one or more radiation measuring systems.

If both a variable aperture system and a radiation measuring system are arranged in or adjacent the IF of the projection system, the radiation measuring system is preferably positioned between the reticle and the variable aperture system. In this way, the variable aperture system does not influence the measuring of the patterned beam.

The variable aperture system may include a masking blade system and the radiation attenuator may include a uniformity correction device. The uniformity correction device may be arranged to dynamically adjust radiation transmittance of the patterned beam at selected locations. Uniformity of the dose delivered to the substrate surface is an important determinant of imaging quality in a lithographic apparatus. If there are variations in the energy density delivered at wafer level across the imaged area this can lead to variations in the size of image features after development of the resist. Uniformity at wafer level can be ensured to a high degree by ensuring that the illumination field (slit) at mask level is uniformly illuminated. In the state of the art, this is achieved for example, by passing the illumination beam through an integrator such as a quartz rod, within which the beam will undergo multiple reflections, or a fly's eye lens, which creates a multiplicity of overlapping images of the source. Nevertheless, uniformity of the patterned beam may need adjustment. According to an embodiment, this is done by way of a uniformity correction device.

The radiation measuring system may include an intensity monitor sensor, such as a diode sensor, for monitoring the intensity of the patterned radiation beam.

In another embodiment, the radiation attenuator itself is arranged to measure the radiation in or adjacent an intermediate focus of the projection system. In this way, no additional measuring system is needed. The radiation attenuator may comprise blades of a uniformity correction device, wherein the blades are connected to an electrical circuit to measure, for example, a photo induced current.

According to a further aspect, there is provided a projection system for a lithographic apparatus as described above, wherein the projection system has an intermediate focus, and the projection system includes, in or adjacent the intermediate focus, a radiation attenuator configured to attenuate the patterned beam, variable aperture system configured to pass at least a part of the patterned beam, and/or a radiation measuring system configured to measure an intensity of the patterned beam.

According to a further aspect of the invention, there is provided a device manufacturing method including projecting a patterned beam of radiation onto a target portion of the substrate using a projection system; attenuating the patterned beam in or adjacent an intermediate focus of the projection system; passing at least a part of the patterned beam by way of a variable aperture system in or near the intermediate focus of the projection; and measuring an intensity of the patterned beam in or adjacent the intermediate focus of the projection system.

The invention also relates to a device manufactured by the method described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. One of ordinary skill will appreciate that, in the context of such alternative applications, any use of the terms "wafer" or "die" herein may be considered as synonymous with the more general terms "substrate" or "target portion", respectively. Further, the substrate referred to herein may be processed, before or after exposure, in for example a track (a tool that typically applies a resist to a substrate and develops the exposed resist) or a metrology or inspection tool. Where applicable, the disclosure herein may be applied to such and other substrate processing tools.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning structure" used herein should be broadly interpreted as referring to means that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning structures may be transmissive or reflective. Examples of patterning structures include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning structures, the support structure may be a frame or table, for example, which may be fixed or movable as required and which may ensure that the patterning structures is at a desired position, for example with respect to the projection system. Any use of the terms "reticle" or "mask" herein may be considered synonymous with the more general term "patterning structures."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the illumination beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture and or 'depth of focus' of UV projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 3 is a schematic view of a masking blades system, together with an exposure area and a reticle;

FIG. 4 is a top view of a uniformity correction system blocking part of the projection beam in an intermediate focus; and FIG. 5 shows circuitry configured to measure an impedance of an element of a radiation attenuator.

DETAILED DESCRIPTION

Figure 1:
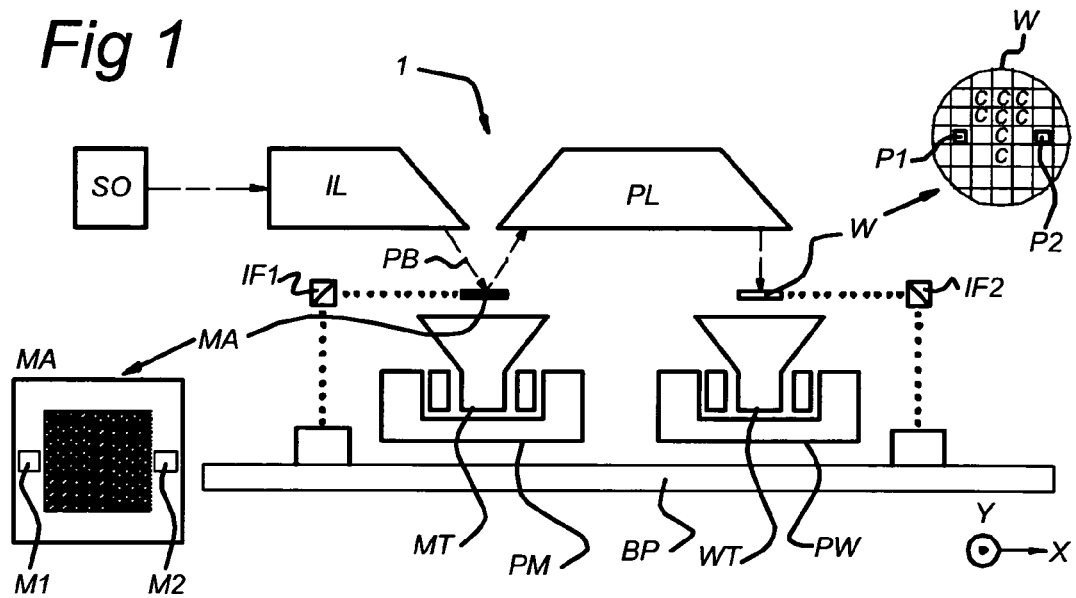
FIG. 1 depicts a lithographic apparatus according to the present invention.

FIG. 1 schematically depicts a lithographic apparatus 1 according to the present invention. The apparatus includes an illumination system (illuminator) IL configured to provide a beam PB of radiation (e.g. UV or EUV radiation).

A first support (e.g. a mask table) MT is configured to support a patterning structure (e.g. a mask) MA and is connected to a first positioning device PM that accurately positions the patterning structure with respect to a projection system (lens) PL. A substrate table (e.g. a wafer table) WT is configured to hold a substrate (e.g. a resist-coated wafer) W and is connected to a second positioning device PW that accurately positions the substrate with respect to the projection system PL.

The projection system (e.g. a reflective projection lens) PL is configured to image a pattern imparted to the beam PB by the patterning structure MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a laser source. In such cases, the source is not considered to form part of the lithographic apparatus and the radiation is generally passed from die source SO to the illuminator IL with the aid of a beam delivery system. In other cases the source may be integral part of the apparatus, for example when the source is a mercury lamp or a plasma source.

The illuminator IL may comprise an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB, having a desired uniformity and intensity distribution in its cross-section.

The beam PB is incident on the mask MA, which is held on the mask table MT. Being reflected by the mask MA, the beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
1. In step mode, the mask table MT and the substrate table WT are kept essentially stationary, while an entire pattern imparted to the beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning structure, and the substrate table WT is moved or scanned while a pattern imparted to the beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes a programmable patterning structure, such as a programmable mirror array of a type as referred to above.

Combinations and/or variations on the above described modes of use or entirely different modes of use may also be employed.

Figure 2:
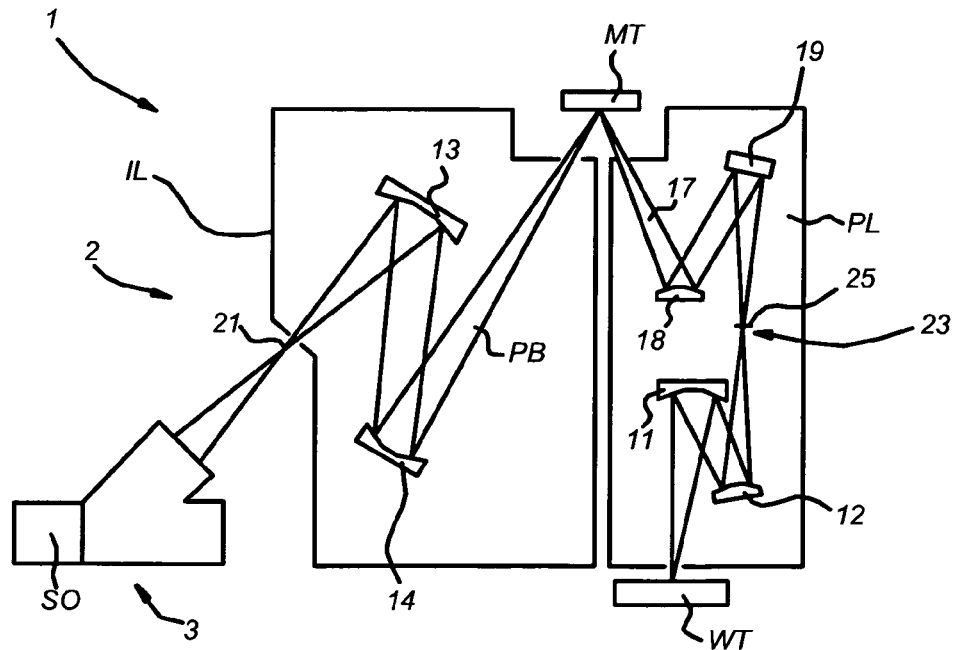
FIG. 2 shows a side view of an EUV illuminating system and projection optics of a lithographic projection apparatus according to the present invention.

FIG. 2 shows the lithographic apparatus 1 including a radiation unit 3, the illumination system IL, and the projection system PL. The radiation unit 3 and the illumination system IL are referred to as radiation system 2. Radiation unit 3 is provided with a radiation source SO, which may be formed by a discharge plasma. The radiation from the radiation unit 3 creates a virtual source at an intermediate focus point 21. The radiation system 2 is configured such that the intermediate focus 21 is disposed at an aperture in the illumination system IL. The beam PB is reflected in illumination system IL via a reflective element 13, via a reflective element 14 onto a reticle or mask (not shown) positioned on reticle or mask table MT. A patterned beam 17 is formed which is imaged in projection system PL via reflective elements 18, 19 through an intermediate focus 23 and via reflective elements 12, 11 onto a wafer stage or substrate table WT. More elements than shown may generally be present in radiation unit 3, illumination system IL and projection system PL.

The lithographic apparatus 1 includes a radiation attenuator 25 substantially arranged in the intermediate focus 23 of the projection system PL. In FIG. 2, the radiation attenuator 25 is situated adjacent or in the intermediate focus 23. It should be understood that the projection system PL may have several intermediate foci, and that the radiation attenuator 25 can be situated in another intermediate focus of the projection system PL instead. The radiation attenuator 25 is configured to attenuate the patterned beam 17. Attenuation may be performed by, for example, absorption or redirection of the radiation. By attenuating the patterned beam 17, the intensity and distribution of the patterned beam 17 on the substrate W can be controlled. The attenuation may vary from 0–100 percent of the beam. In the case of 100 percent attenuation, the beam is blocked completely.

A variable aperture system 30 may be situated in or near the intermediate focus 23. The system 30 includes masking blades. FIG. 3 shows an example of the masking blade system including two masking blades 31, 32 configured to mask part of the patterned beam 17. By masking part of the patterned beam 17, only an exposure area 36 of a die is illuminated on the substrate W. The masking blades 31, 32 may be moved in a X direction in order to adjust the exposure area 36. If a reticle 38 is illuminated, the patterned beam 17 will contain pattern information between lines 41, 42 respectively, as shown in FIG. 3. In practice, the patterned beam 17, which is banana-shaped, exceeds the lines 41, 42. This means that the out-of-field areas 51, 52, will also receive radiation. According to an embodiment of the invention, these out-of-field areas 51 and/or 52 are used to place an intensity monitor sensor 61 for measuring an intensity of the patterned beam 17. The intensity monitor sensor 61 may be, for example, a diode sensor. By positioning the intensity monitor sensor 61 in the out-of-field area 51 or 52 an intensity of the patterned beam 17 can be measured without influencing the intensity of the patterned beam 17 on the substrate W. The intensity monitor sensor 61 may be positioned in a Z direction perpendicular to the X and Y direction depicted in FIG. 3, between the reticle and the variable aperture system. In this way the variable aperture system 25 does not influence the measuring of the patterned beam, which is advantageous. It should be noted that in the above embodiment, masking blades may be added to limit the exposure area 36 in the Y direction. It may be advantageous to separate X and Y masking blades physically, for example, the Y blades being near the reticle in the illumination system, but the X blades being at the intermediate focus of the projection system.

The radiation attenuator may include a uniformity correction device arranged in or adjacent the intermediate focus 23. The uniformity correction device is arranged to correct the uniformity of the intensity of the patterned beam. FIG. 4 shows an example of a uniformity correction device 68 including blades 70 for blocking part of the patterned beam 17. A contour 72 of the banana-shaped patterned beam 17 in the intermediate focus 23 is shown in FIG. 4. The blades 70 of the uniformity correction device 63 may be dynamically adjusted by a drive unit, not shown, to dynamically alter the transmission of the patterned beam at selected locations. The drive unit is arranged to move the blades 70 in the Y direction, as was indicated in FIG. 3. If, for some reason, the intensity in a certain X location is to high, certain blades 70 situated in that X location will be moved further to the right, i.e. in the Y direction. In this way the uniformity of the intensity of the patterned beam 17 reaching the substrate, will be corrected.

The radiation attenuator may itself be configured to measure an intensity of the patterned beam. FIG. 5 shows an example of a electrical circuit configured to measure the resistance of an element, for example, a blade 70 of a uniformity correction device. The element is arranged such that if the patterned beam 17 is incident on the radiation attenuator, the electrical properties, i.e. the resistance, of the element will change. By measuring, for example, the resistance of the element, the intensity of the patterned beam 17 is indirectly measured. In FIG. 5, a current meter 93 and a voltage source 94 are shown. Other electrical configurations are possible, as will be appreciated by those skilled in the art. When the radiation attenuator 25 comprises a plurality of elements, such as lamellas or wires, the electrical properties of the respective elements can be measured. In this way, a spatial intensity distribution of the radiation beam can be determined.

While specific embodiments of the invention have been described above, it will be appreciated that the invention may be practiced otherwise than as described. The description is not intended to limit the invention.

What is claimed is:

1. A lithographic apparatus, comprising:
an illumination system configured to provide a beam of radiation;
a support configured to support a patterning structure, the patterning structure configured to impart the beam of radiation with a pattern in its cross-section;
a substrate table configured to hold a substrate; and
a projection system configured to project the patterned beam onto a target portion of the substrate, the projection system having an intermediate focus wherein, the apparatus comprises, in or adjacent the intermediate focus,
a radiation attenuator configured to attenuate the patterned beam;
a variable aperture system configured to pass at least a part of the patterned beam; and/or
a radiation measuring system configured to measure an intensity of the patterned beam, wherein the radiation attenuator comprises a uniformity correction device comprising a plurality of blades configured to block part of the patterned beam, the uniformity correction device being configured to enhance the uniformity of the intensity of the patterned beam on the substrate and to dynamically adjust a radiation transmittance of the patterned beam at selected locations and the radiation measuring system comprises an intensity monitor sensor.

2. An apparatus according to claim 1, wherein the at least one variable aperture system comprises at least two masking blades configured to mask part of the patterned beam.

3. An apparatus according to claim 1, wherein the intensity monitor sensor comprises a diode sensor.

4. An apparatus according to claim 1, wherein radiation attenuator is configured to measure an intensity of the patterned beam.

5. An apparatus according to claim 4, further comprising an electrical circuit configured to measure electrical properties of elements of the radiation attenuator in order to determine the intensity of the patterned beam.

6. An apparatus according to claim 1, wherein the beam of radiation has a wavelength in the range of 5–20 nm.

7. A projection system for a lithographic apparatus, the projection system having an intermediate focus, wherein the projection system comprises, in or adjacent the intermediate focus,
a attenuator configured to attenuate a patterned beam,
a variable aperture system configured to pass at least a part of the patterned beam, and/or
at least one radiation measuring system configured to measure an intensity of the patterned beam wherein the radiation attenuator comprises a uniformity correction device comprising a plurality of blades configured to block part of the patterned beam, the uniformity correction device being configured to enhance the uniformity of the intensity of the patterned beam on the substrate and to dynamically adjust a radiation transmittance of the patterned beam at selected locations and the radiation measuring system comprises an intensity monitor sensor.

8. A device manufacturing method, comprising:
projecting a patterned beam of radiation onto a target portion of a substrate using a projection system;
attenuating the patterned beam in or adjacent an intermediate focus of the projection system;
passing at least a part of the patterned beam in or adjacent the intermediate focus of the projection system; and
measuring an intensity of the patterned beam in or adjacent the intermediate focus of the projection system, wherein attenuating the patterned beam comprises correcting a uniformity of the patterned beam by blocking part of the patterned beam and dynamically adjusting a radiation transmittance of the patterned beam at selected locations, and measuring the intensity of the patterned beam comprises measuring the intensity with an intensity monitor sensor.

9. A lithographic apparatus, comprising:
means for providing a beam of radiation;
means for supporting a patterning means for imparting the beam of radiation with a pattern in its cross-section;
means for holding a substrate; and
means for projecting the patterned beam onto a target portion of the substrate, the projection system having an intermediate focus wherein, the apparatus comprises, in or near the intermediate focus,
means for attenuating the patterned beam;
means for passing at least a part of the patterned beam; and/or
means for measuring an intensity of the patterned beam, wherein the means for attenuating comprises means for enhancing the uniformity of the intensity of the patterned beam on the substrate and dynamically adjusting a radiation transmittance of the patterned beam at selected locations and the means for measuring comprises an intensity monitor sensor.

10. An apparatus according to claim 9, wherein the means for attenuating comprises at least two masking blades configured to mask part of the patterned beam.

11. An apparatus according to claim 9, wherein the means for enhancing uniformity comprises a plurality of blades configured to block part of the patterned beam.

12. An apparatus according to claim 9, wherein the intensity monitor sensor comprises a diode sensor.

13. An apparatus according to claim 9, wherein the means for attenuating comprises an electrical circuit configured to measure electrical properties of elements of the means for attenuating in order to determine the intensity of the patterned beam.

* * * * *